United States Patent [19]
Terui

[11] Patent Number: 6,060,774
[45] Date of Patent: May 9, 2000

[54] SEMICONDUCTOR DEVICE

[75] Inventor: Makoto Terui, Tokyo, Japan

[73] Assignee: Oki Electric Industry Co., Ltd., Tokyo, Japan

[21] Appl. No.: 08/962,115

[22] Filed: Oct. 31, 1997

[30] Foreign Application Priority Data

Feb. 12, 1997 [JP] Japan ..................................... 9-027425

[51] Int. Cl.[7] .............................. H01L 23/48; H01L 25/52
[52] U.S. Cl. .......................... 257/692; 257/691; 257/698; 257/729
[58] Field of Search .................................. 257/698, 787, 257/687, 729, 700, 691, 692

[56] References Cited

U.S. PATENT DOCUMENTS

| | | | |
|---|---|---|---|
| 4,839,713 | 6/1989 | Teraoka et al. | 257/787 |
| 5,689,091 | 11/1997 | Hamzehdoost et al. | 257/698 |
| 5,767,568 | 6/1998 | Tsuruzono | 257/687 |

FOREIGN PATENT DOCUMENTS

| | | |
|---|---|---|
| 0 731 506 | 9/1996 | European Pat. Off. . |
| 97 40532 | 10/1997 | WIPO . |

*Primary Examiner*—Sheila V. Clark
*Attorney, Agent, or Firm*—Rabin & Champagne, PC

[57] ABSTRACT

A copper sheet having an aperture provided therein at a bonding area for clearing the semiconductor chip and its bonding wires is bonded by an adhesive to a sealing side of an organic substrate which has been loaded on the sealing side with a pattern of copper foil wiring. The copper sheet is higher in adhesiveness to a sealing resin than to any conventional resist. A resultant semiconductor device according to the present invention will prevent detachment of the sealing resin at an interface, which may result from a thermal history in the sealing or reflow process and eliminate entrance of water, hence minimizing a decline in resistance to moisture.

20 Claims, 6 Drawing Sheets

SEMICONDUCTOR DEVICE

BACKGROUND OF THE INVENTION

The present invention relates to a semiconductor device and particularly, a structure of a plastic ball grid array package (referred to as P-BGA hereinafter).

The structure of a common P-BGA is explained referring to the relevant drawings.

FIG. 11 is a cross-sectional view of the P-BGA and FIG. 12 is an enlarged view showing the region A of FIG. 11.

Shown are an organic substrate 1, a copper foil wiring pattern 2, a semiconductor chip 4, bonding wires 5, a sealing resin 7, a resist 8, a grounding layer 9, and solder paste balls 12.

For production of the P-BGA structure, general steps are (1) coating the organic substrate 1, made of e.g. bismaleic triazine resin and equipped with the copper foil wiring pattern 2 having a thickness of 10 to 40 micrometers, with the resist 8 for protecting most regions of the wiring pattern 2 where no bonding wires are connected, placing the semiconductor chip 4 by a conductive paste on the substrate 1, (2) connecting electrodes of the semiconductor chip 4 by the bonding wires 5 to the wiring pattern 2 on the organic substrate 1, (3) sealing with the sealing resin 7 one side of the substrate 1 where the semiconductor chip 4 is mounted, and (4) applying a grid form of balls 12 on the other side of the substrate 1.

The conventional P-BGA however allows the resist 8, which contains a silicon component unfavorable for adhesiveness to the sealing resin 7, to cover most regions of the organic substrate 1 to be sealed with the sealing resin 7. The sealing resin 7 of a particular type may cause the resist 8 to release its silicon component as triggered by a thermal history in the sealing or reflow process during the mounting to a mother board, and subsequently detach at its interface from the sealing resin 7, thus reducing the resistance to moisture.

SUMMARY OF THE INVENTION

It is a primary object of the present invention, in view of the foregoing drawback of the conventional semiconductor device, to provide a novel, improved semiconductor device capable of preventing detachment of a sealing resist at an interface, which detachment may otherwise result from a thermal history in the sealing or reflow process, and eliminating an entrance of water, thus to minimize a reduction in resistance to moisture.

It is another object of the present invention to provide a novel, improved semiconductor device in which a copper sheet bonded to a substrate has a die pad formed integrally thereon for supporting a semiconductor chip in order to build radiator passages for releasing heat generated by the semiconductor chip, whereby the semiconductor chip can be produced to operate at a higher power consumption.

It is a further object of the present invention to provide a novel, improved semiconductor device in which a copper sheet is electrically connected to a grounding layer provided within an organic substrate thus to have a strip line structure, whereby signal lines may have a reduced inductance, be simplified so as to have a desired combination of characteristic impedance, and generate minimum crosstalk therebetween because of the sealing effect of grounding.

It is a still further object of the present invention to provide a novel, improved semiconductor device in which the side edge of an organic substrate is covered with a copper sheet to prevent an entrance of water from side directions, hence increasing the resistance to moisture.

It is a still further object of the present invention to provide a novel, improved semiconductor device in which the number of grounding terminals in a ball mounting area is minimized, thus permitting the number of I/O terminals to be increased and the use of terminals per package to be optimized.

It is a still further object of the present invention to provide a novel, improved semiconductor device in which signal bonding terminals are located inwardly to minimize the length of bonding wires, thereby to suppress the inductance of signal lines and reduce the generation of noise.

For achievement of the foregoing objects, a first feature of the present invention is embodied in the form of a plastic ball grid array package in which a copper sheet which has an aperture provided therein for clearing a semiconductor chip and its bonding wires, is bonded to a sealing side of an organic substrate.

A second feature of the present invention is embodied in the form of a plastic ball grip array package in which a copper sheet, having a die pad formed integrally thereon for supporting a semiconductor chip, is bonded by an adhesive to a sealing side of an organic substrate.

A third feature of the present invention is embodied in the form of a plastic ball grip array package in which a copper sheet is bonded by an adhesive to a sealing side of an organic substrate and electrically connected along through holes, to a grounding layer provided within the organic substrate.

A fourth feature of the present invention is embodied in the form of a plastic ball grip array package in which a copper sheet is bonded by an adhesive to a sealing side of an organic substrate, mechanically folded at four side ends downwardly and towards the rear side of the organic substrate to cover the side edge of the organic substrate, electrically connected along through holes to the grounding layer in the organic substrate, and loaded at its folded ends with solder paste balls by platings of a nickel/gold alloy.

A fifth feature of the present invention is embodied in the form of a plastic ball grip array package in which a copper sheet having an aperture therein is bonded by an adhesive to a sealing side of an organic substrate, electrically connected along through holes to the grounding layer in the organic substrate, and provided about the aperture with nickel/gold platings of a spot form, which serve as grounding terminals.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

In the drawings.

PREFERRED EMBODIMENT OF THE PRESENT INVENTION

Preferred embodiments of the present invention in the form of a semiconductor device will be described in more detail referring to the accompanying drawings. For ease of the description, like components which are substantially identical to each other in both construction and function, are denoted by like numerals and will be explained without repetition.

Figure 1:
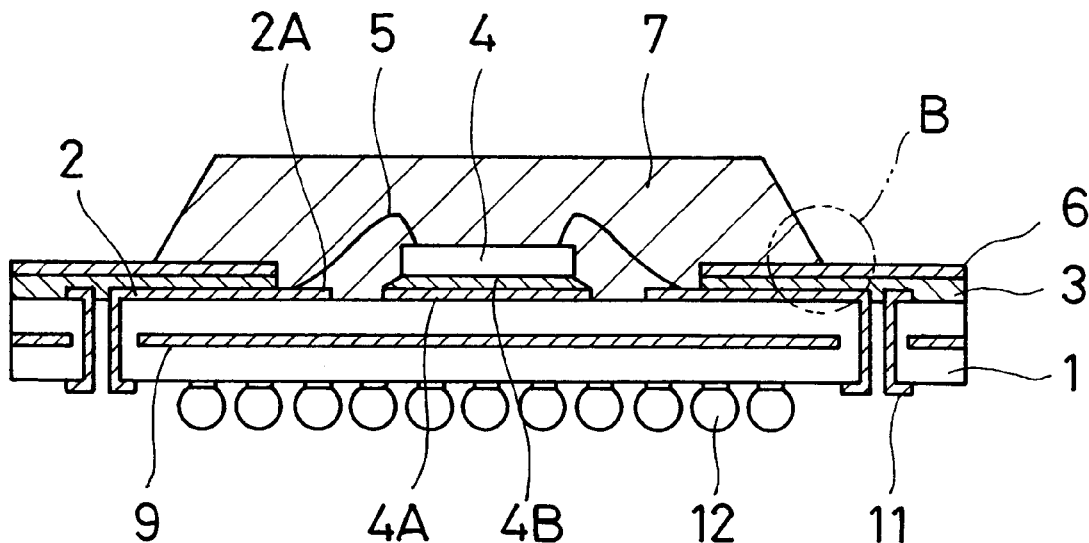
FIG. 1 is a cross-sectional view of a P-BGA according to a first embodiment of the present invention.
Figure 2:
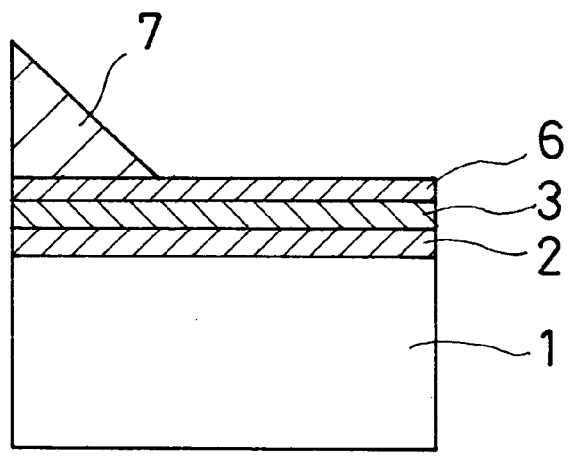
FIG. 2 is an enlarged view showing the region B of FIG. 1.
Figure 3:
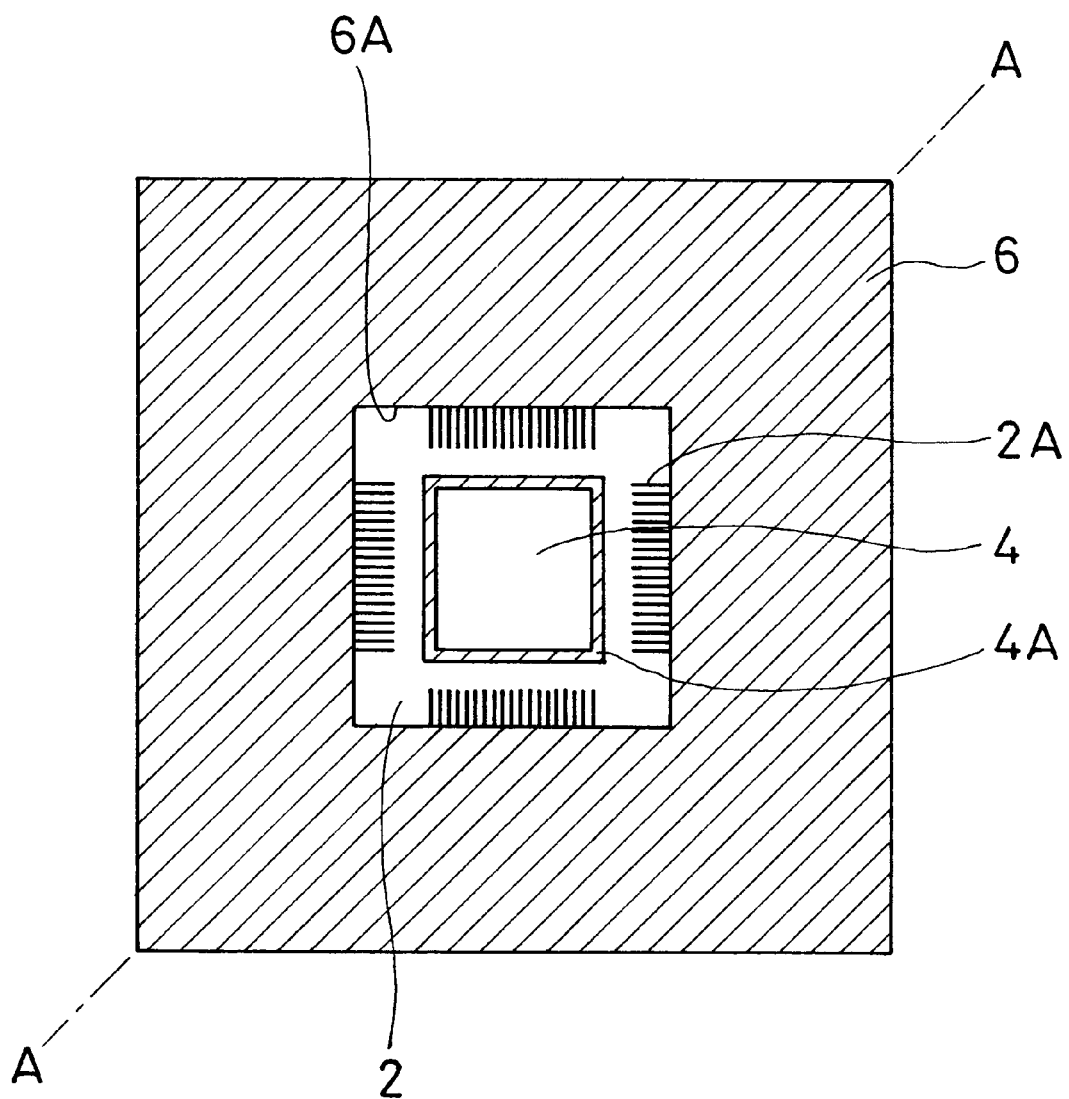
FIG. 3 is a plan view of the P-BGA of the first embodiment viewed from the substrate sealing side.

FIG. 1 is a cross-sectional view of a P-BGA (taken along the line A—A of FIG. 3), showing a first embodiment of the present invention. FIG. 2 is an enlarged view of the region B of FIG. 1. FIG. 3 is a plan view of the P-BGA of the first embodiment viewed from the substrate sealing side.

As shown, the P-BGA is produced by applying a copper foil wiring pattern 2 on one side of an organic substrate 1 and bonding, by an adhesive 3 to the sealing side of the organic substrate 1, a copper sheet 6 which is 0.1 to 0.4 mm thick and has an aperture 6A for clearing a semiconductor chip 4 and bonding wires 5. The semiconductor chip 4 is bonded by an adhesive 4B to a die pad 4A located in a predetermined region of the organic substrate 1. The bonding wires 5 connect the semiconductor chip 4 to bonding terminals 2A of the wiring pattern 2.

The sealing side of the organic substrate 1 of the P-BGA is covered with the copper sheet 6. The sheet 6 has a higher adhesiveness to the sealing resin 7 than a common resist, whereby detachment of the sealing resin 7 after the reflow process will be prevented and a decline in the resistance to moisture will be minimized.

According to the first embodiment, the copper sheet 6 bonded on the sealing side of the organic substrate 1 is favorable for adhesion to the sealing resin 7 as compared with the common resist 8. This prevents the detachment of the sealing resin 7 which may result from the thermal history in the seating or reflow process and will permit no entrance of water hence minimizing declination in the resistance to moisture.

In addition, the copper sheet 6 (of a conductive material) is located over the signal lines of the pattern thus attenuating the inductance of signals.

A second embodiment of the present invention will now be described.

Figure 4:
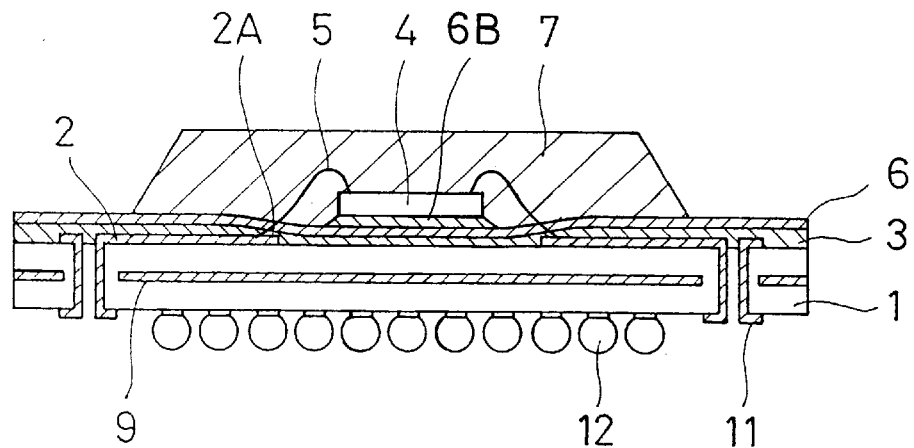
FIG. 4 is a cross-sectional view of a P-BGA according to a second embodiment of the present invention.
Figure 5:
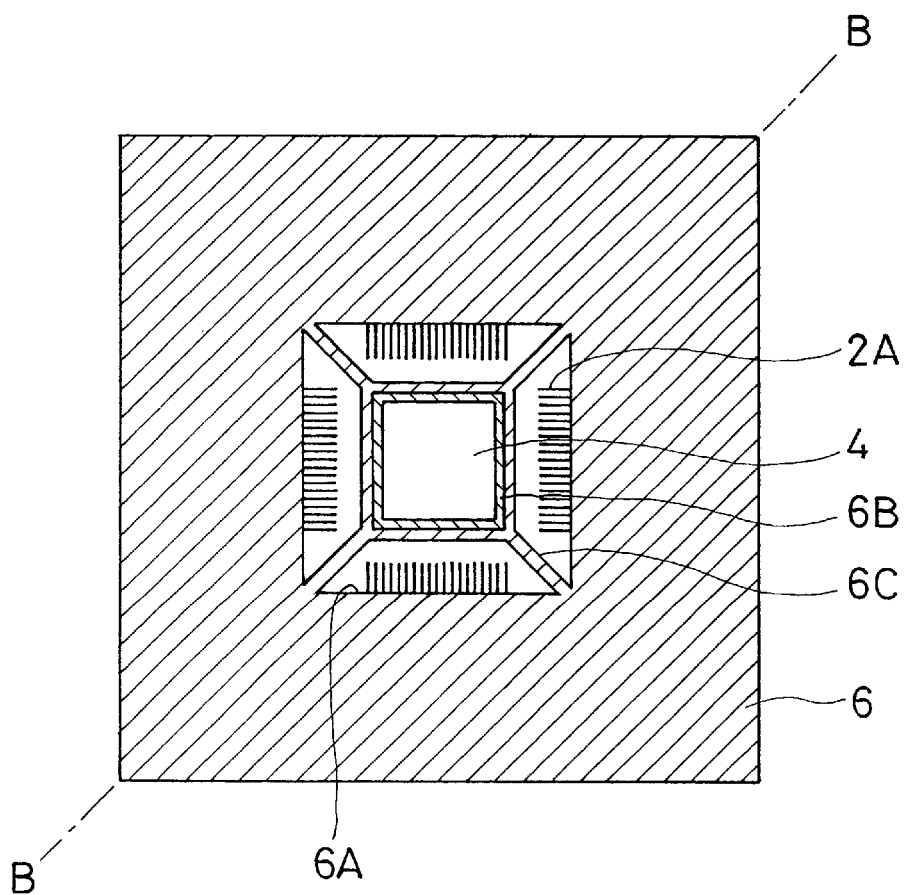
FIG. 5 is a plan view of the P-BGA of the second embodiment viewed from the substrate sealing side.

FIG. 4 is a cross-sectional view of a P-BGA (taken along the line B-B of FIG. 5) showing the second embodiment. FIG. 5 is a plan view of the P-BGA of the second embodiment viewed from the substrate sealing side.

The second embodiment is distinguished from the first embodiment in the following respects. While the copper sheet 6 bonded to the sealing side of the substrate 1 in the first embodiment, has the aperture 6A therein for providing a bonding area for the semiconductor chip 4 and its bonding wires 5, apertures in the second embodiment are made for clearing only the bonding wires 5 while a die pad 6B on which the semiconductor chip 4 is mounted is formed integrally with the copper sheet 6.

Since the copper sheet 6 having the die pad 6B formed integrally thereon for supporting the semiconductor chip 4 is bonded on the sealing side of the organic substrate 1 of the P-BGA, its high adhesiveness to the sealing resin 7 prevents detachment from the sealing resin 7 after the sealing or reflow process and will minimizes future declination in the resistance to moisture.

Also, the copper sheet 6 formed integrally with the die pad 6B on which the semiconductor chip 4 is mounted, has heat radiator passages 6C thereon for releasing heat generated by the semiconductor chip 4, hence decreasing the thermal resistance.

According to the second embodiment, the copper sheet 6 bonded to the sealing side of the organic substrate 1 is favorable for adhesion to the sealing resin 7, as compared with the common resist. This prevents the detachment of the sealing resin 7 which may otherwise result from the thermal history in the seating or reflow process, and further prevents the entrance of water, hence minimizing declination in the resistance to moisture.

In addition, as the copper sheet 6 has the die pad 6B formed integrally thereon for supporting the semiconductor chip 4, the heat generated by the semiconductor chip 4 can be dissipated along the die pad 6B and the heat radiator passages 6C to the copper sheet 6, thereby improving the efficiency of heat radiation and allowing a high power consumption type of the semiconductor chip 4 to be employed. As in the first embodiment, the bonding wires 5 connect the semiconductor chip 4 to bonding terminals 2A of the wiring pattern 2.

A third embodiment of the present invention will be described.

Figure 6:
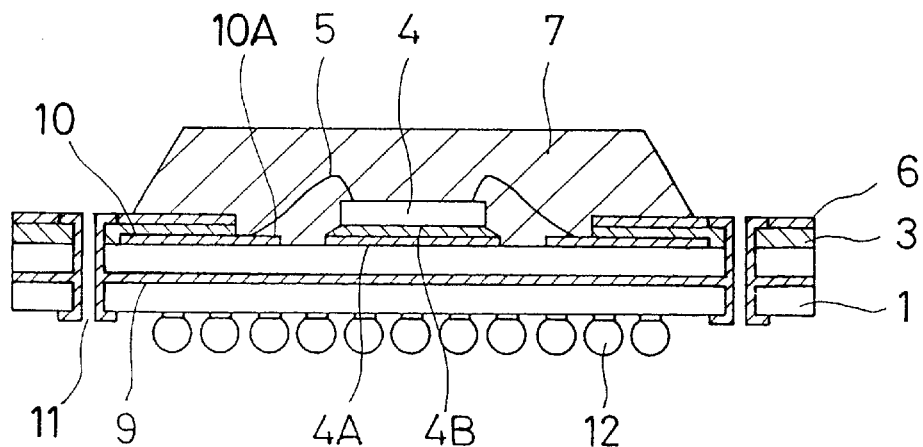
FIG. 6 is a cross-sectional view of a P-BGA according to a third embodiment of the present invention.
Figure 7:
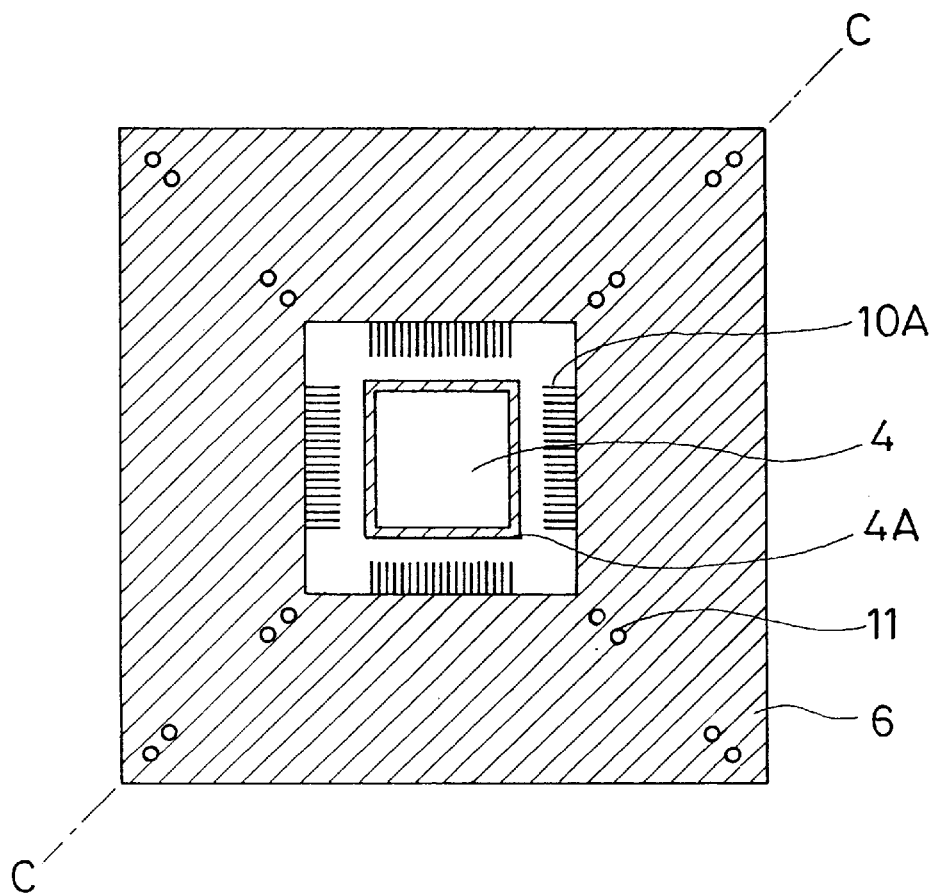
FIG. 7 is a plan view of the P-BGA of the third embodiment viewed from the substrate sealing side.

FIG. 6 is a cross-sectional view of a P-BGA (taken along the line C—C of FIG. 7) showing the third embodiment. FIG. 7 is a plan view of the P-BGA of the third embodiment viewed from the substrate sealing side.

As shown, the copper sheet 6, having a thickness of 0.1 to 0.4 mm, is bonded by an adhesive 3 to the sealing side of the organic substrate 1 after a pattern of signal lines 10 made from copper foil, are placed on the sealing side of the organic substrate 1.

Also, the copper sheet 6 is electrically connected along through holes 11 to a grounding layer 9 provided within the organic substrate 1.

Figure 12:
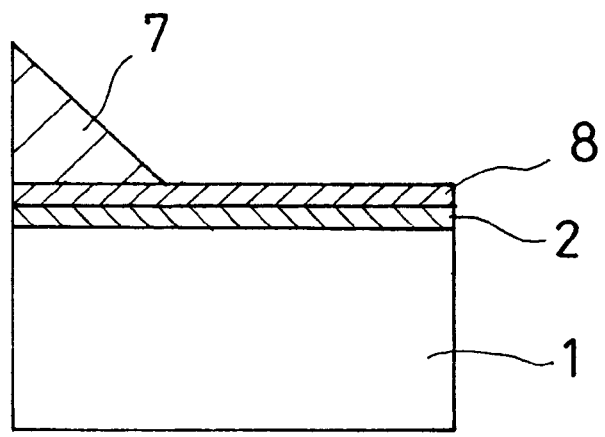
FIG. 12 is an enlarged view showing the region A of FIG. 11.

The sealing side of the organic substrate 1 of the P-BGA is covered with the copper sheet 6, which is higher in adhesiveness to the sealing resin 7 than is the common resist used in the conventional P-BGA of FIG. 12, whereby detachment of the sealing resin 7 after the reflow process will be prevented and declination in the resistance to moisture will be minimized.

Since the copper sheet 6 is electrically connected along the through holes 11 to the grounding layer 9 provided within the organic substrate 1, the signal lines 10 between the copper sheet 6 and the grounding layer 9 are subjected to a grounding potential, thereby enhancing the electrical characteristics. Referring to FIG. 6, denoted by 10A are bonding terminals of the signal lines which are connected by the bonding wires 5 to the semiconductor chip 4.

According to the third embodiment, the copper sheet 6 bonded on the sealing side of the organic substrate 1 is favorable for adhesion to the sealing resin 7 as compared with the common resist 8 of the conventional device of FIG. 12. This prevents the detachment of the sealing resin 7 which may result from the thermal history in the seating or reflow process and prevents the entrance of water, thereby minimizing declination of the resistance to moisture.

The copper sheet 6 electrically connected along the through holes 11 to the grounding layer 9 provided within the organic substrate 1, allows the signal lines 10 between the copper sheet 6 and the grounding layer 9 to be subjected to a grounding potential (in a strip-line structure). As a result, the signal lines 10 will be decreased in inductance, simplified so as to have a desired combination of characteristic impedance, and minimized in the generation of crosstalk therebetween because of the sealing effect of the grounding potential.

A fourth embodiment of the present invention will be described.

Figure 8:
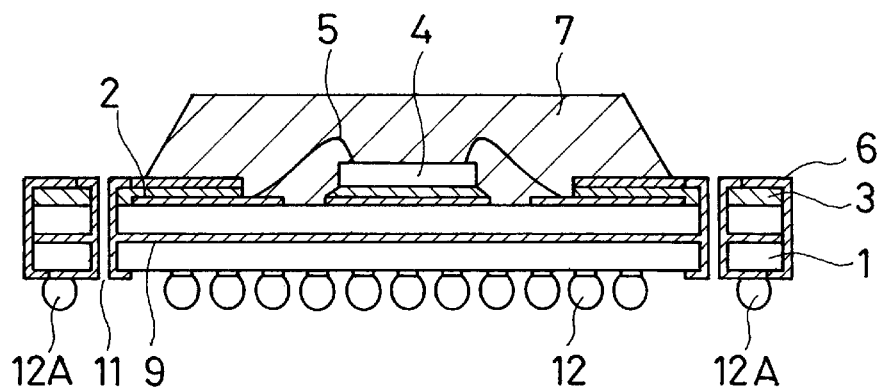
FIG. 8 is a cross-sectional view of a P-BGA according to a fourth embodiment of the present invention.

FIG. 8 is a cross-sectional view of a P-BGA showing the fourth embodiment of the present invention.

In this embodiment, the 0.1 to 0.4 mm thick copper sheet 6 is bonded by an adhesive 3 to the sealing side of the organic substrate 1 after a pattern of copper foil wiring 2 is placed on the sealing side of the organic substrate 1. Then, the copper sheet 6 is folded at four side ends downwardly and towards the rear side of the organic substrate 1 so as to cover the side edge of the organic substrate 1.

Also, the copper sheet 6 is electrically connected along through holes 11 to a grounding layer 9 provided within the organic substrate 1. Four folded ends of the copper sheet 6 at the edge of the rear side of the organic substrate 1 are plated with nickel/gold alloy and then loaded with solder paste balls 12A.

According to the fourth embodiment, the copper sheet 6 bonded on the sealing side of the organic substrate 1 of the P-BGA is favorable for adhesion to the sealing resin 7 as compared with the common resist 8. This prevents the detachment of the sealing resin 7 which may result from the thermal history in the seating or reflow process and will permit no entrance of water hence minimizing declination in the resistance to moisture.

The side edge of the organic substrate 1 is also covered with the copper sheet 6 and thus prevents entrance of water from side directions increasing the resistance to moisture.

Also, the solder paste balls 12A are mounted on the folded ends of the copper sheet 6 which is electrically connected by the through holes 11 to the grounding layer 9 provided within the organic substrate 1, hence minimizing the number of grinding terminals at the ball mounting area as compared with the conventional semiconductor device. This permits installation of a larger number of I/O terminals, whereby the number of terminals that can be used per package can be optimized.

A fifth embodiment of the present invention will now be described.

Figure 9:
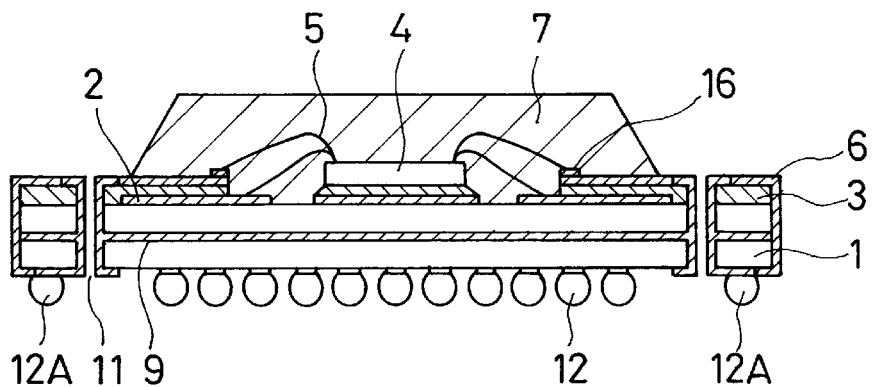
FIG. 9 is a cross-sectional view of a P-BGA according to a fifth embodiment of the present invention.
Figure 10A:
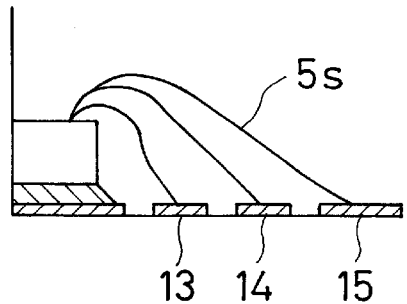
FIG. 10 is an explanatory view showing the advantage of the P-BGA of the fifth embodiment.
Figure 10B:
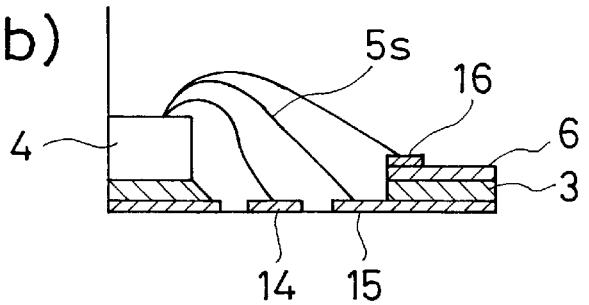
Figure 11:
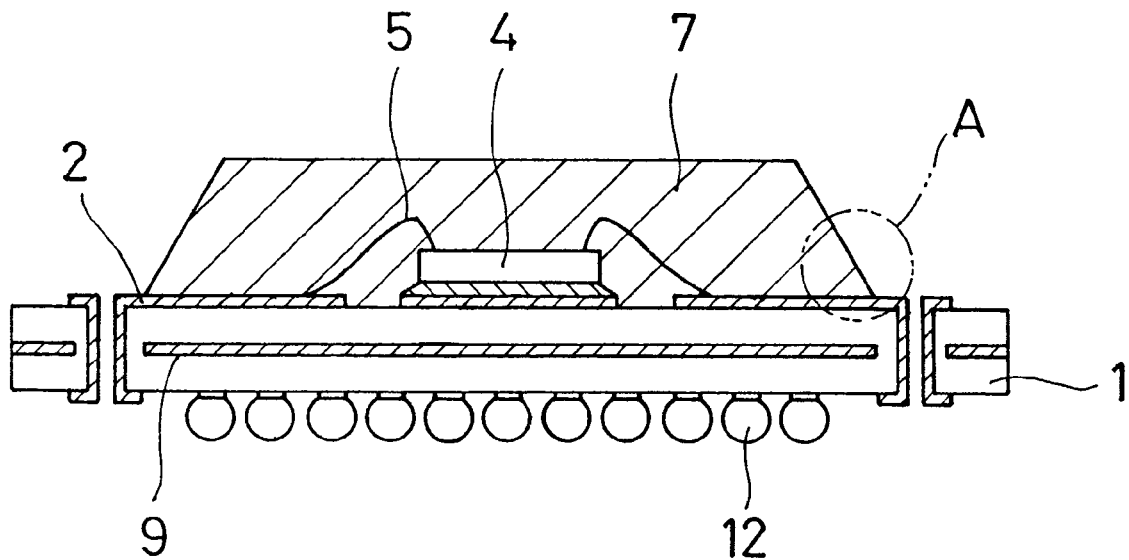
FIG. 11 is a cross-sectional view of a conventional P-BGA.

FIG. 9 is a cross-sectional view of a P-BGA showing the fifth embodiment of the present invention and FIG. 10 is an explanatory view of the advantage on the P-BGA.

In this embodiment, the copper sheet 6 bonded to the organic substrate as described above with respect to the third or fourth embodiments, is plated with a nickel/gold alloy 16 at specific spots about the apertures (0.5 to 1.0 mm from the edge). The plated spots 16 serve as grounding ports and are connected by bonding wires 5 to the grounding terminals of the semiconductor chip 4.

In a high-speed device, signal bonding wires 5 extend to signal bonding terminals 15 which are located outside the source bonding terminals 14 and the grounding terminals 13 (in an annular arrangement about a die pad) and are thus increased in length, as shown in FIG. 10(*a*).

Referring to FIG. 10(*b*), the fifth embodiment allows the nickel/gold plated spots 16 to be formed on the copper sheet 6 on the organic substrate 1, and serve as the grounding terminals so that source bonding terminals 14 and signal bonding terminals 15 are located inwardly. As a result, bonding wires 5s extending from the signal bonding terminals 15 are reduced in length.

According to the fifth embodiment, in addition to the advantages of the third and fourth embodiments, the signal bonding terminals 15 are located more inside as compared with any conventional semiconductor device and thus the bonding wires are minimized in length, whereby the signal lines are suppressed in inductance and reduced in the generation of noise.

Although the preferred embodiments of the present invention have been described, they are not of limitations. It would be understood by those skilled in the art that various changes and modifications are made without departing from the scope and spirit of the present invention defined in the appended claims as fall within the scope and spirit of the present invention.

As set forth above, the present invention offers the following advantages.

According to the first feature of the present invention, the copper sheet bonded to the sealing side of the organic substrate is higher in adhesiveness to the sealing resin than any conventional resist. This prevents detachment of the sealing resin at the interface, which might otherwise result from the thermal history in the sealing or reflow process and eliminates entrance of water, thus minimizing a declination in the resistance to moisture.

According to the second feature of the present invention, the copper sheet on the organic substrate is formed integral with the die pad on which a semiconductor chip is mounted, thereby allowing heat generated by the semiconductor chip to dissipate with higher efficiency. Since the efficiency of heat radiation is increased, a higher power consumption type of the semiconductor chip can be mounted.

According to the third feature of the present invention, the copper sheet on the organic substrate is electrically connected along the through holes to the grounding layer provided within the organic substrate, hence constituting a strip line structure in which the signal lines between the copper sheet and the grounding layer are subjected to a grounding potential. As a result, the signal lines are decreased in inductance, simplified so as to have a desired combination of characteristic impedance, and minimized in the generation of crosstalk therebetween because of the sealing effect of the grounding potential.

According to the fourth feature of the present invention, the side edge of the organic substrate is covered with the copper sheet, and thus prevents entrance of water from side directions to thereby increase the resistance to moisture. In addition, the solder paste balls are mounted on the folded ends of the copper sheet which is electrically connected along the through holes to the grounding layer in the organic substrate, hence minimizing the number of grinding terminals at the ball mounting area as compared with the conventional semiconductor device. This permits an installation of a greater number of I/O terminals, whereby the per package use of terminals can be optimized.

According to the fifth embodiment of the present invention, the grounding terminals are formed on the folded ends of the copper sheet bonded to the organic substrate so that the signal bonding terminals are located inwardly, whereby the bonding wires can be reduced in the length.

As a result, the signal lines are successfully suppressed in inductance and reduced in the generation of noise.

The entire disclosure of Japanese Patent Application No. 9-27425 filed on Feb. 12, 1997, including specification, claims, drawings, and summary, is incorporated herein by reference.

What is claimed is:

1. A semiconductor device comprising:
   an organic substrate having a sealing side;
   a semiconductor chip mounted on the organic substrate;
   bonding wires connected to the semiconductor chip;
   a copper sheet having an aperture provided therein at a bonding area, positioned so that the cooper sheet clears the semiconductor chip and the bonding wires;
   an adhesive layer bonding the copper sheet to the sealing side of the organic substrate; and
   a grounding layer provided within the organic substrate, wherein the organic substrate has through holes and the copper sheet is electrically connected to the grounding layer along the through holes.

2. A semiconductor device according to claim 1, further comprising grounding terminals of a spot shape provided on the copper sheet about the aperture.

3. A semiconductor device, comprising:
   an organic substrate having a sealing side, a side edge, and a rear side opposite the sealing side;
   a semiconductor chip mounted on the organic substrate;
   bonding wires connected to the semiconductor chip;
   a copper sheet having an aperture provided therein at a bonding area, positioned so that the copper sheet clears the semiconductor chip and the bonding wires, the copper sheet further having peripheral extensions mechanically folded downwardly and toward the rear side of the organic substrate so as to cover the side edge of the organic substrate; and
   an adhesive layer bonding the copper sheet to the sealing side of the organic substrate.

4. A semiconductor device according to claim 3, further comprising a grounding layer provided within the organic substrate, wherein the organic substrate has through holes and the copper sheet is electrically connected to the grounding layer along the through holes.

5. A semiconductor device according to claim 4, further comprising connection terminals on the folded peripheral extensions of the copper sheet.

6. A semiconductor device, comprising:
   an organic substrate having a sealing side;
   a semiconductor chip mounted on the organic substrate;
   bonding wires connected to the semiconductor chip;
   a copper sheet having a bonding wire area for the bonding wires and an aperture at the bonding wire area;
   a die pad formed integrally on the copper sheet, supporting the semiconductor chip, the aperture being positioned so as to clear the bonding wires;
   a first adhesive layer bonding the copper sheet to the sealing side of the organic substrate;
   a second adhesive layer bonding the semiconductor chip to the die pad; and
   a grounding layer within the organic substrate, wherein the organic substrate has through holes therein and the copper sheet is electrically connected along the through holes to the grounding layer.

7. A semiconductor device according to claim 6, further comprising connection terminals of a spot shape for grounding, disposed on the copper sheet about the aperture.

8. A semiconductor device, comprising:
   an organic substrate having a sealing side, a rear side opposite the sealing sides and a side edge;
   a semiconductor chip mounted on the organic substrate, bonding wires connected to the semiconductor chip;
   a copper sheet having a bonding wire area for the bonding wires and an aperture at the bonding wire area, the copper sheet further having peripheral extensions mechanically folded downwardly and towards the rear side of the organic substrate so as to cover the side edge of the organic substrate;
   a die pad formed integrally on the copper sheet, supporting the semiconductor chip, the aperture being positioned so as to clear the bonding wires;
   a first adhesive layer bonding the copper sheet to the sealing side of the organic substrate; and
   a second adhesive layer bonding the semiconductor chip to the die pad.

9. A semiconductor device according to claim 8, further comprising a grounding layer within the organic substrate, wherein the organic substrate has through holes therein and the copper sheet is electrically connected along the through holes to the grounding layer.

10. A semiconductor device according to claim 9, further comprising connection terminals on the folded peripheral extensions of the copper sheet.

11. A semiconductor device comprising:
    a substrate having a principal surface;
    a wiring pattern formed on the principal surface of the substrate;
    a semiconductor chip mounted on the substrate and having a plurality of electrodes which are electrically connected to the wiring pattern;
    a copper sheet fixed on the wiring pattern using an adhesive layer which insulates the copper sheet and the wiring pattern, said copper sheet being formed around the semiconductor chip;
    a sealing resin disposed over said semiconductor chip and over said copper sheet so as to seal said semiconductor chip and said copper sheet, said sealing resin being in direct contact with said copper sheet at substantially all locations said sealing resin is disposed over said copper sheet; and
    a grounding layer provided within the substrate, wherein the substrate has through holes and the copper sheet is electrically connected to the grounding layer along the through holes.

12. A semiconductor device according to claim 11, further comprising grounding terminals of a spot shape provided on the copper sheet and about the semiconductor chip.

13. A semiconductor device, comprising:
    a substrate having a principal surface;
    a wiring pattern formed on the principal surface of the substrate;
    a semiconductor chip mounted on the substrate and having a plurality of electrodes which are electrically connected to the wiring pattern;

a copper sheet fixed on the wiring pattern using an adhesive layer which insulates the copper sheet and the wiring pattern, said copper sheet being formed around the semiconductor chip; and a sealing resin disposed over said semiconductor chip and over said copper sheet so as to seal said semiconductor chip and said copper sheet, said sealing resin being in direct contact with said copper sheet at substantially all locations said sealing resin is disposed over said copper sheet, wherein the substrate has a side edge, and has a rear side opposite the principal surface, and wherein the copper sheet has peripheral extensions mechanically folded downwardly and toward the rear side of the substrate so as to cover the side edge of the substrate.

14. A semiconductor device according to claim 13, further comprising a grounding layer provided within the substrate, wherein the substrate has through holes, and the copper sheet is electrically connected to the grounding layer along the through holes.

15. A semiconductor device according to claim 14, further comprising connection terminals on the folded peripheral extensions of the copper sheet.

16. A semiconductor device comprising:

a substrate having a principal surface;

a wiring pattern formed on the principal surface of the substrate, said wiring pattern having a bonding portion;

a copper sheet fixed on the wiring pattern using an adhesive layer which insulates the copper sheet and the wiring pattern, said copper sheet being formed over substantially an entirety of the principal surface except for an area corresponding to the bonding portion of the wiring pattern;

a semiconductor chip mounted on the copper sheet and having a plurality of electrodes which are electrically connected to the bonding portion of the wiring pattern;

a sealing resin sealing the semiconductor chip and the copper sheet; and a grounding layer provided within the substrate, wherein the substrate has through holes and the copper sheet is electrically connected to the grounding layer along the through holes.

17. A semiconductor device according to claim 16, further comprising grounding terminals of a spot shape provided on the copper sheet and about the semiconductor chip.

18. A semiconductor device, comprising:

a substrate having a principal surface;

a wiring pattern formed on the principal surface of the substrate, said wiring pattern having a bonding portion;

a copper sheet fixed on the wiring pattern using an adhesive layer which insulates the copper sheet and the wiring pattern, said copper sheet being formed over substantially an entirety of the principal surface except for an area corresponding to the bonding portion of the wiring pattern;

a semiconductor chip mounted on the copper sheet and having a plurality of electrodes which are electrically connected to the bonding portion of the wiring pattern; and a sealing resin sealing the semiconductor chin and the copper sheet, wherein the substrate has a side edge, and has a rear side opposite the principal surface, and wherein the copper sheet has peripheral extensions mechanically folded downwardly and toward the rear side of the substrate so as to cover a side edge of the substrate.

19. A semiconductor device according to claim 18, further comprising a grounding layer provided within the substrate, wherein the substrate has through holes, and the copper sheet is electrically connected to the grounding layer along the through holes.

20. A semiconductor device according to claim 19, further comprising connection terminals on the folded peripheral extensions of the copper sheet.

* * * * *